US010882221B2

(12) United States Patent
Hsieh et al.

(10) Patent No.: US 10,882,221 B2
(45) Date of Patent: Jan. 5, 2021

(54) PEELING METHOD OF FLEXIBLE SUBSTRATE

(71) Applicant: BOE Technology Group Co., Ltd., Beijing (CN)

(72) Inventors: Ming Che Hsieh, Beijing (CN); Chunyan Xie, Beijing (CN); Lu Liu, Beijing (CN); Hejin Wang, Beijing (CN); Yuanzheng Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 262 days.

(21) Appl. No.: 15/574,068

(22) PCT Filed: Apr. 10, 2017

(86) PCT No.: PCT/CN2017/079893
§ 371 (c)(1),
(2) Date: Nov. 14, 2017

(87) PCT Pub. No.: WO2017/181860
PCT Pub. Date: Oct. 26, 2017

(65) Prior Publication Data
US 2018/0290344 A1    Oct. 11, 2018

(30) Foreign Application Priority Data

Apr. 18, 2016 (CN) .......................... 2016 1 0244839

(51) Int. Cl.
*B29C 35/08*   (2006.01)
*B32B 7/12*    (2006.01)
(Continued)

(52) U.S. Cl.
CPC ............ *B29C 35/0805* (2013.01); *B32B 7/12* (2013.01); *H01L 21/6835* (2013.01);
(Continued)

(58) Field of Classification Search
CPC ............... H01L 21/683; H01L 21/6831; H01L 21/6833; H01L 21/3835; H01L 21/68369;
(Continued)

(56) References Cited

U.S. PATENT DOCUMENTS 4,388,128 A    6/1983   Ogawa et al.
9,634,270 B2   4/2017   Liu et al.
(Continued)

FOREIGN PATENT DOCUMENTS

CN    101833215 A    9/2010
CN    102385999 A    3/2012
(Continued)

OTHER PUBLICATIONS

English Translation of International Search Report from International Patent Application No. PCT/CN2017/079893, dated Jul. 14, 2017, 6 pages.

*Primary Examiner* — Joseph S Del Sole
*Assistant Examiner* — Jamel M Nelson
(74) *Attorney, Agent, or Firm* — Westman, Champlin & Koehler, P.A.

(57) ABSTRACT

This disclosure relates to a peeling method of a flexible substrate, and belongs to the technical field of flexible display. The method comprises the steps of: (a) forming a flexible substrate on a base substrate, wherein the flexible substrate has a plane area less than that of the base substrate; (b) adhering a protective film on the base substrate formed with the flexible substrate by an ultraviolet viscosity-reducing adhesive, wherein the plane area of the flexible substrate is less than that of the protective film, and the protective film is further adhered to the base substrate by the ultraviolet viscosity-reducing adhesive; (c) irradiating a region on the base substrate covered by the protective film through the base substrate with an ultraviolet light; and (d) peeling the (Continued)

protective film and the flexible substrate from the base substrate after the irradiation with an ultraviolet light is completed.

9 Claims, 2 Drawing Sheets

(51) Int. Cl.
*H01L 21/683* (2006.01)
*B29C 41/02* (2006.01)
*B29L 31/34* (2006.01)

(52) U.S. Cl.
CPC ...... *B29C 41/02* (2013.01); *B29C 2035/0827* (2013.01); *B29L 2031/3475* (2013.01)

(58) Field of Classification Search
CPC . H01L 21/6838; B29C 35/0805; B29C 41/02; B29C 2035/0827; B29L 2031/3475
See application file for complete search history.

(56) References Cited

U.S. PATENT DOCUMENTS

| | | | |
|---|---|---|---|
| 2014/0312368 A1* | 10/2014 | Lee | H01L 33/08 |
| | | | 257/89 |
| 2015/0125665 A1* | 5/2015 | Nakase | B32B 5/145 |
| | | | 428/172 |

FOREIGN PATENT DOCUMENTS

| | | | |
|---|---|---|---|
| CN | 103400792 A | | 11/2013 |
| CN | 103540269 A | * | 1/2014 |
| CN | 103540269 A | | 1/2014 |
| CN | 104167513 A | | 11/2014 |
| CN | 103400792 B | * | 12/2015 |
| CN | 105895573 A | | 8/2016 |

* cited by examiner

PEELING METHOD OF FLEXIBLE SUBSTRATE

CROSS-REFERENCE TO RELATED APPLICATION

This application claims priority benefits of Chinese Application No. 201610244839.9 filed on Apr. 18, 2017, the entire contents of which are hereby incorporated by reference.

FIELD OF THE INVENTION

This disclosure relates to the technical field of flexible display, and particularly to a peeling method of a flexible substrate.

BACKGROUND OF THE INVENTION

A flexible display apparatus is a display apparatus produced on the basis of a flexible substrate. Since the flexible display apparatus has the characteristics of deformability, bendability, and the like, the flexible display apparatus has been used more and more widely.

In the process of producing a flexible display apparatus, a flexible substrate is required to be peeled from a base substrate. Before the flexible substrate is peeled, an adhesive is required to adhere a protective film onto the flexible substrate. Then, the flexible substrate is irradiated by using a laser peeling technique so as to separate the flexible substrate from the base substrate. Finally, a cutter is inserted from the side surface of the adhesive between the protective film and the base substrate to cut the adhesive so as to remove the flexible substrate.

In the process of implementing this disclosure, the inventor has found that the following problem is at least present in the prior art.

Since the adhesion of the adhesive is relatively high, the adhesive will rebind after the adhesive is cut, so that the efficiency of peeling the flexible substrate is relatively low.

SUMMARY OF THE INVENTION

In order to solve the problems in the prior art, the embodiments of this disclosure provide a peeling method of a flexible substrate. The technical solutions are as follows.

In one aspect, there is provided a peeling method of a flexible substrate, comprising the steps of:

(a) forming a flexible substrate on a base substrate, wherein the flexible substrate has a plane area less than that of the base substrate;

(b) adhering a protective film on the base substrate formed with the flexible substrate by an ultraviolet viscosity-reducing adhesive, wherein the plane area of the flexible substrate is less than that of the protective film, and the protective film is further adhered to the base substrate by the ultraviolet viscosity-reducing adhesive;

(c) irradiating a region on the base substrate covered by the protective film through the base substrate with an ultraviolet light; and (d) peeling the protective film and the flexible substrate from the base substrate after the irradiation with an ultraviolet light is completed.

Optionally, before the step (b), the method further comprises a step of:

forming a blocking layer pattern on the base substrate formed with the flexible substrate, wherein the blocking layer pattern is located on the periphery of the flexible substrate.

Optionally, the step (c) comprises:

irradiating a preset region in the region on the base substrate covered by the protective film through the base substrate with an ultraviolet light, wherein the preset region is a part of an region on the periphery of the flexible substrate.

Optionally, the blocking layer pattern comprises a plurality of blocking sub-structures, and the plurality of the blocking sub-structures are in an array arrangement on the periphery of the flexible substrate.

Optionally, the blocking sub-structure is a rectangular structure.

Optionally, the rectangular structure has a width in a range of 0.1 mm to 1.0 mm, and the width direction of the rectangular structure is parallel to the arrangement direction of the rectangular structure.

Optionally, a ratio of the width of the rectangular structure to a gap width is in a range of 1:1 to 1:5, wherein the width direction of the rectangular structure is parallel to the arrangement direction of the rectangular structure, and the gap width is a distance between two adjacent blocking sub-structures.

Optionally, the blocking layer pattern is formed from a metal material.

Optionally, the blocking layer pattern has a thickness in a range of 500 Å to 3000 Å.

Optionally, the base substrate is a transparent substrate.

Optionally, before the step (b), the method further comprises a step of:

forming a display element on the flexible substrate

BRIEF DESCRIPTION OF THE DRAWINGS

In order to illustrate the technical solutions in embodiments of this disclosure more clearly, the figures required for describing the embodiments will be simply introduced below. It is apparent that the figures described below are merely some embodiments of this invention, and other figures may be further obtained by those of ordinary skill in the art according to these figures without exerting inventive work.

DETAILED DESCRIPTION OF THE INVENTION

In order to enable the objects, technical solutions, and advantages of this invention to be more clear, the embodiments of this invention will be further described in details in conjunction with accompanying drawings.

Figure 1:
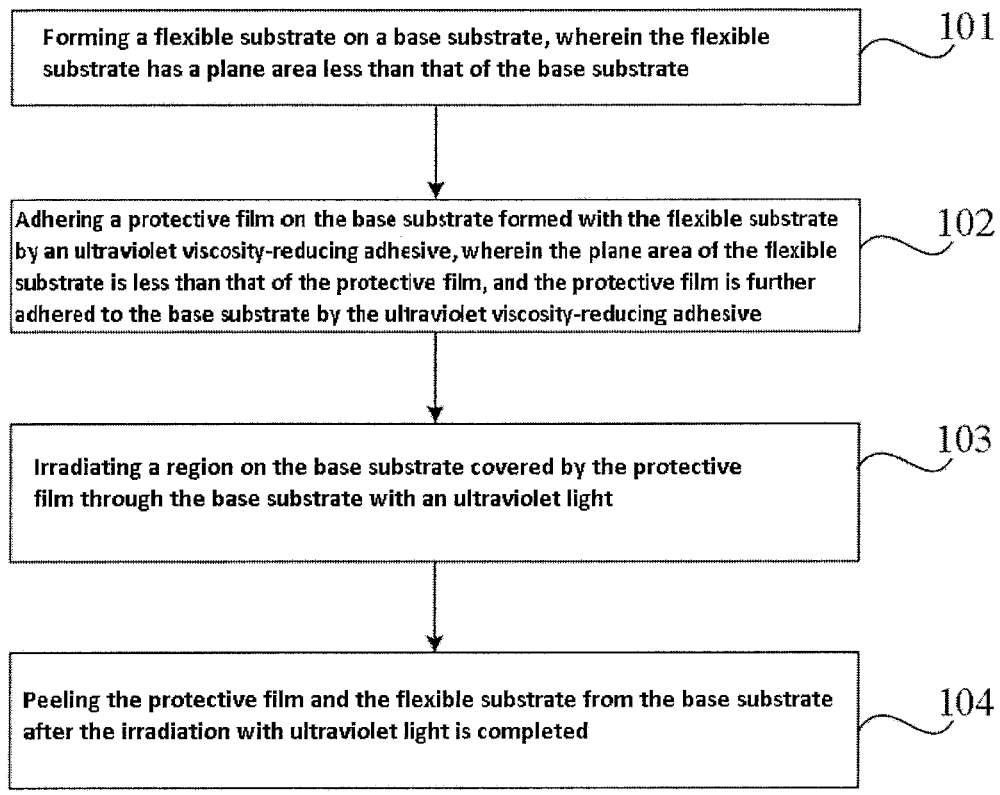
FIG. 1 is a flow chart of a peeling method of a flexible substrate provided in an embodiment of this disclosure.

FIG. 1 is a flow chart of a peeling method of a flexible substrate provided in an embodiment of this disclosure, and as shown in FIG. 1, this method comprises the steps of:

Step 101, forming a flexible substrate on a base substrate, wherein the flexible substrate has a plane area less than that of the base substrate.

Figure 2:
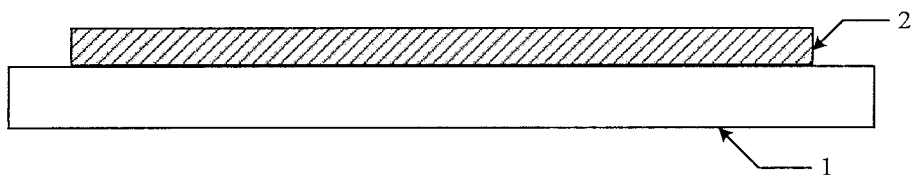
FIG. 2 is a side view of a laminate in the process of the production of a flexible substrate provided in an embodiment of this disclosure.

Particularly, as shown in FIG. 2, a flexible substrate 2 is produced on a base substrate 1. Further, the plane area of the flexible substrate 2 is less than that of the base substrate 1, and the base substrate 1 fully covers the flexible substrate 2. Here, this base substrate 1 is a transparent substrate. Preferably, this base substrate 1 is a glass substrate.

It is to be indicated that after the flexible substrate 2 is formed on the base substrate 1, a blocking layer pattern 3 may be further formed on the base substrate 1 formed with the flexible substrate 2, so that there is a certain adhesion on the periphery of the flexible substrate 2, i.e., between the region of the blocking layer pattern 3 and the base substrate 1 in subsequent steps, to prevent the flexible substrate 2 from falling off the base substrate 1.

Figure 3:
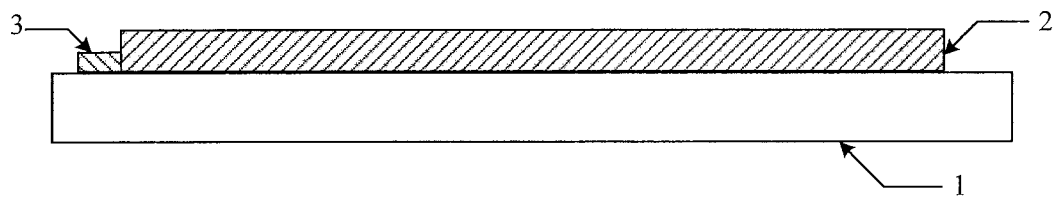
FIG. 3 is a side view of a laminate in the process of the production of a flexible substrate provided in an embodiment of this disclosure.
Figure 4:
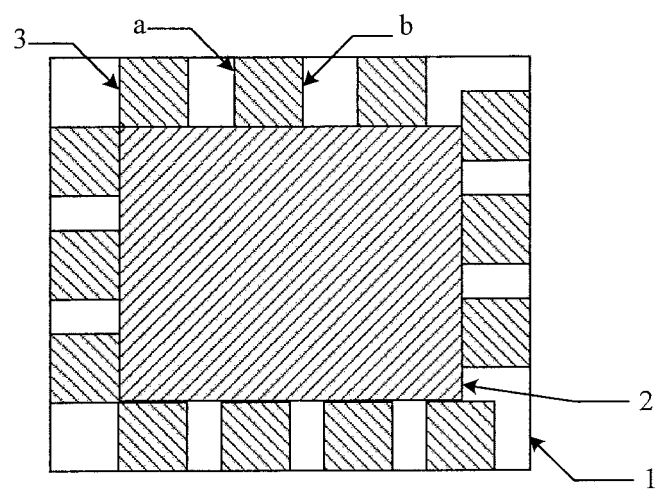
FIG. 4 is a top view of a laminate in the process of the production of a flexible substrate provided in an embodiment of this disclosure.

Exemplarily, as shown in FIG. 3, on the basis of the base substrate 1 formed with the flexible substrate 2, the blocking layer pattern 3 may be formed on the base substrate 1 by a one-time patterning process, such as processes of photoresist coating, exposing, developing, etching and peeling a photoresist, and the like. As shown in FIG. 4, this blocking layer pattern 3 is located on the periphery of the flexible substrate 2.

Further, as shown in FIG. 4, this blocking layer pattern 3 comprises a plurality of blocking sub-structures, and the plurality of the blocking sub-structures are in an array arrangement on the periphery of the flexible substrate 2. This blocking sub-structure may be a rectangular structure, or may be a structure of another pattern, and is not limited in the embodiments of this disclosure.

Here, when this blocking sub-structure is a rectangular structure, the width of the rectangular structure has a value range of 0.1 mm (millimeters) to 1.0 mm, and the width direction of the rectangular structure is parallel to the arrangement direction of the rectangular structure. That is, the width direction of this rectangular structure is parallel to the border of the adjacent flexible substrate 2. As shown in FIG. 4, the width of this rectangular structure is the distance between the two borders a and b of the blocking sub-structure.

Additionally, when the blocking sub-structures having the rectangular structure are subjected to an array arrangement, they may be arranged at a certain ratio according to the width of this rectangular structure and the gap width between two adjacent blocking sub-structures, and this gap width is the shortest distance between two adjacent blocking sub-structures. Preferably, the ratio of the width of this rectangular structure to this gap width has a value range of 1:1 to 1:5, and the blocking sub-structures may be arranged at different ratios so as to control the adhesion between the periphery of the flexible substrate 2 and the base substrate 1 in subsequent steps.

Further, this blocking layer pattern 3 is formed of a metal material, and the metal material is selected from Ag, Al, Mo, and the like. Preferably, the thickness of this blocking layer pattern 3 has a value range of 500 Å (Angstroms) to 3000 Å.

Furthermore, it is to be indicated that after the production of the flexible substrate 2 on the base substrate 1 is completed, a display element may be either formed on this flexible substrate 2 before the blocking layer pattern 3 is formed or formed on this flexible substrate 2 while the blocking layer pattern 3 is formed.

Step 102, adhering a protective film on the base substrate formed with the flexible substrate by an ultraviolet viscosity-reducing adhesive, wherein the plane area of the flexible substrate is less than that of the protective film, and the protective film is further adhered to the base substrate by the ultraviolet viscosity-reducing adhesive.

Figure 5:
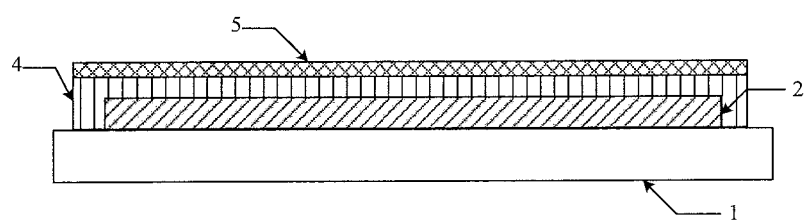
FIG. 5 is a side view of a laminate in the process of the production of a flexible substrate provided in an embodiment of this disclosure.

Particularly, as shown in FIG. 5, a protective film 5 is adhered onto the base substrate 1 formed with the flexible substrate 2 by an ultraviolet (UV) viscosity-reducing adhesive 4, so that this protective film 5 can cover a region where the flexible substrate 2 is located and a region on the periphery of the flexible substrate 2.

The "ultraviolet viscosity-reducing adhesive" mentioned in this disclosure is not specifically limited, and it refers to an adhesive whose viscosity can be significantly reduced upon irradiation with an ultraviolet light. Specific examples of the ultraviolet viscosity-reducing adhesive are, for example, aliphatic urethane acrylate oligomers, aromatic urethane acrylate oligomers, and the like. A commercially available product of the ultraviolet viscosity-reducing adhesive is, for example, PL 2360UV produced by Horae New Material Co., Ltd.

Here, the plane area of the flexible substrate 2 is less than that of the protective film 5. The adhesion is greatly reduced after this ultraviolet viscosity-reducing adhesive 4 is irradiated with an ultraviolet light so as to remove the flexible substrate 2 from the base substrate 1.

Step 103, irradiating a region on the base substrate covered by the protective film through the base substrate with an ultraviolet light.

In practical applications, since the base substrate 1 may be provided with the blocking layer pattern 3 or may not be provided with the blocking layer pattern 3, the whole region or a part of region on this base substrate 1 covered by this protective film 5 may be irradiated with an ultraviolet light, in order to prevent the occurrence of circumstances such as the flexible substrate 2 falling off the base substrate 1 and the like before the peeling of the protective film 5 and the flexible substrate 2. Illustration is made in embodiments of this disclosure in two aspects below.

In a first aspect, when the blocking layer pattern 3 is formed on the base substrate 1, the whole region on this base substrate 1 covered by this protective film 5 may be irradiated with an ultraviolet light.

Exemplarily, an ultraviolet light may be irradiated from the side of the base substrate 1 to the side of the flexible substrate 2 through this base substrate 1, and the region irradiated is the whole region covered by the protective film 5. After the irradiation with an ultraviolet light, the adhesion of the ultraviolet viscosity-reducing adhesive 4 irradiated with ultraviolet is greatly reduced, so that the flexible substrate 2 may be conveniently removed from the base substrate 1 in subsequent steps.

Further, since the blocking layer pattern 3 is formed on the base substrate 1, the ultraviolet light is blocked by the blocking layer pattern 3 in the process of the irradiation with an ultraviolet light to prevent the ultraviolet viscosity-reducing adhesive 4 on the blocking layer pattern 3 from being irradiated with an ultraviolet light. The ultraviolet viscosity-reducing adhesive 4 corresponding to the blocking layer pattern 3 is not irradiated with an ultraviolet light to maintain the adhesion unchanged, so that there is a certain adhesion between the flexible substrate 2 and the base substrate 1 and the occurrence of circumstances such as the flexible substrate 2 falling off the base substrate 1 and the like may be prevented before the peeling of the protective film 5 and the flexible substrate 2.

In a second aspect, when a blocking layer pattern 3 is not formed on the base substrate 1, a part of the region on this base substrate 1 covered by this protective film 5 may be irradiated with an ultraviolet light.

Exemplarily, a preset region in the region on the base substrate 1 covered by the protective film 5 may be irradiated through the base substrate 1 with an ultraviolet light. This preset region is a part of the region covered by the protective film 5. For example, this preset region may be a region where the flexible substrate 2 is located and a part of a region on the periphery of the flexible substrate 2. That is, all regions covered by the protective film 5 are the preset region except a part of the region on the periphery of the flexible substrate 2. This preset region may also be a part of the region on the periphery of the flexible substrate 2, and is not limited in embodiments of this disclosure. The adhesion is greatly reduced after the ultraviolet viscosity-reducing adhesive 4 located in the preset region is irradiated with an ultraviolet light, so that the flexible substrate 2 may be conveniently peeled from the base substrate 1 in subsequent steps. Furthermore, the ultraviolet viscosity-reducing adhesive outside of the preset region is not irradiated with an ultraviolet light to maintain the adhesion unchanged, so that there is a certain adhesion between the flexible substrate 2 and the base substrate 1 and the occurrence of circumstances such as the flexible substrate 2 falling off the base substrate 1 and the like may be prevented before the peeling of the protective film 5 and the flexible substrate 2.

For example, the substrate surface of the flexible substrate 2 may be a rectangle with four borders and correspondingly has four peripheral regions. When the region covered by the protective film 5 is irradiated with an ultraviolet light, a part of the region in the four peripheral regions described above may be not irradiated, but only the region where the flexible substrate 2 is located and the remaining region in the four peripheral regions on the periphery of the flexible substrate 2 are irradiated.

It is to be indicated that when the region on the base substrate 1 covered by the protective film 5 is irradiated through the base substrate 1 with an ultraviolet light and if the ultraviolet light irradiates the flexible substrate 2, the amount of the ultraviolet light transferred through the flexible substrate 2 to the ultraviolet viscosity-reducing adhesive 4 located in an region corresponding to the flexible substrate 2 is greatly reduced and is nearly null. Therefore, the ultraviolet viscosity-reducing adhesive 4 located in the region of the flexible substrate 2 remains to have an effective adhesion, the adhesion of the protective film 5 and the flexible substrate 2 may be ensured, and the relative position of both of them is maintained to be unchanged after peeling.

It is worth illustrating that when a blocking layer pattern 3 is formed on the base substrate 1, a part of the region on this base substrate 1 covered by this protective film 5 may also be irradiated with an ultraviolet light. The part of region can be referred to the definition of the preset region in the second aspect described above. All of the modifications, equivalent replacements, improvements, and the like, which are within the spirit and the principle of the two aspects described above, should be encompassed in the scope protected by this invention. Verbose words are omitted in embodiments of this disclosure.

Further, the process of the irradiation with an ultraviolet light described above may be sustained for a preset duration. This preset duration may be set according to specific circumstances, and is not limited in embodiments of this disclosure.

Step 104, peeling the protective film and the flexible substrate from the base substrate after the irradiation with an ultraviolet light is completed.

In the process of the irradiation with an ultraviolet light, the flexible substrate 2 may absorb the heat generated by the energy of ultraviolet light. This heat may allow that a gap is generated between the flexible substrate 2 and the base substrate 1 and the adhesion between the flexible substrate 2 and the base substrate 1 is reduced, and the flexible substrate 2 may be peeled from the base substrate 1 with only a minute external force. Furthermore, since the adhesion of the ultraviolet viscosity-reducing adhesive 4 is reduced under the irradiation of ultraviolet light, it may be convenient to concurrently peel the flexible substrate 2 and the protective film 5 from the base substrate 1 by using a cutter. The peeled flexible substrate 2 and protective film 5 adhere to each other and the relative position thereof is unchanged.

In the peeling method of a flexible substrate provided in an embodiment of this disclosure, a flexible substrate is formed on a base substrate, a protective film is adhered onto the base substrate formed with the flexible substrate by an ultraviolet viscosity-reducing adhesive, a region on the base substrate covered by the protective film is irradiated through the base substrate with an ultraviolet light, and the protective film and the flexible substrate are peeled from the base substrate after the irradiation with an ultraviolet light is completed. By forming a flexible substrate on a base substrate and adhering a protective film by using an ultraviolet viscosity-reducing adhesive, the problem that the adhesive will rebind after the adhesive is cut is avoided, and the efficiency of peeling the flexible substrate has been improved and the flexibility of peeling the flexible substrate has been increased. Further, in an embodiment of this disclosure, the viscosity of the ultraviolet viscosity-reducing adhesive may be adjusted by different patternings of the blocking layer pattern, or the viscosity of the ultraviolet viscosity-reducing adhesive may be adjusted by different regions irradiated with an ultraviolet light, so as to achieve the integrated peeling of the flexible substrate and the protective film.

All of the optional technical solutions described above may be arbitrarily combined to form the optional embodiments of this disclosure, and verbose words are omitted herein.

It can be understood by those of ordinary skill in the art that all or a part of steps which achieve the embodiments described above may be accomplished by a hardware or may be accomplished by a program instructing a related hardware. The program may be stored in a computer-readable storage medium, and the storage medium mentioned above may be a read-only memory, a magnetic disk, an optical disk, or the like.

Those described above are merely the preferred embodiments of this invention, and are not intended to limit this invention. All of modifications, equivalent replacements, improvements, and the like, which are within the spirit and the principle of this invention, should be encompassed in the scope protected by this invention.

What is claimed is:

1. A peeling method of a flexible substrate, comprising the steps of:
    (a) forming a flexible substrate on a base substrate, wherein the flexible substrate and the base substrate are contacted directly and the flexible substrate has a plane area less than that of the base substrate, and forming a display element on the flexible substrate;
    (b) forming a blocking layer pattern on the base substrate formed with the flexible substrate, wherein the blocking layer pattern is located on the periphery of the flexible substrate, and adhering a protective film on the base substrate formed with the flexible substrate by an ultraviolet viscosity-reducing adhesive, wherein the plane area of the flexible substrate is less than that of the protective film, the protective film is further adhered to the base substrate by the ultraviolet viscosity-reducing adhesive, and the protective film does not contact the flexible substrate;

(c) irradiating a region on the base substrate covered by the protective film through the base substrate with an ultraviolet light; and (d) peeling the protective film and the flexible substrate from the base substrate after the irradiation with an ultraviolet light is completed.

2. The method according to claim 1, wherein the step (c) comprises:

irradiating a preset region in the region on the base substrate covered by the protective film through the base substrate with an ultraviolet light, wherein the preset region is a part of an region on the periphery of the flexible substrate.

3. The method according to claim 1, wherein the blocking layer pattern comprises a plurality of blocking sub-structures, and the plurality of the blocking sub-structures are in an array arrangement on the periphery of the flexible substrate.

4. The method according to claim 3, wherein the blocking sub-structure is a rectangular structure.

5. The method according to claim 4, wherein the rectangular structure has a width in a range of 0.1 mm to 1.0 mm, and the width direction of the rectangular structure is parallel to the arrangement direction of the rectangular structure.

6. The method according to claim 4, wherein a ratio of the width of the rectangular structure to a gap width is in a range of 1:1 to 1:5, wherein the width direction of the rectangular structure is parallel to the arrangement direction of the rectangular structure, and the gap width is a distance between two adjacent blocking sub-structures.

7. The method according to claim 1, wherein the blocking layer pattern is formed from a metal material.

8. The method according to claim 1, wherein the blocking layer pattern has a thickness in a range of 500 Å to 3000 Å.

9. The method according to claim 1, wherein the base substrate is a transparent substrate.

* * * * *